(12) United States Patent
Shibata et al.

(10) Patent No.: US 10,193,001 B2
(45) Date of Patent: Jan. 29, 2019

(54) NITRIDE SEMICONDUCTOR DEVICE

(71) Applicant: PANASONIC CORPORATION, Osaka (JP)

(72) Inventors: Daisuke Shibata, Kyoto (JP); Kenichiro Tanaka, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/698,222

(22) Filed: Sep. 7, 2017

(65) Prior Publication Data

US 2017/0373200 A1 Dec. 28, 2017

Related U.S. Application Data

(63) Continuation of application No. PCT/JP2016/000655, filed on Feb. 9, 2016.

(30) Foreign Application Priority Data

Mar. 17, 2015 (JP) ................................. 2015-054067

(51) Int. Cl.
*H01L 29/872* (2006.01)
*H01L 21/82* (2006.01)
(Continued)

(52) U.S. Cl.
CPC .......... *H01L 29/872* (2013.01); *H01L 21/822* (2013.01); *H01L 21/8234* (2013.01);
(Continued)

(58) Field of Classification Search
CPC ......... H01L 21/82; H01L 27/06; H01L 27/09; H01L 27/08; H01L 29/86; H01L 21/80
(Continued)

(56) References Cited

U.S. PATENT DOCUMENTS

2004/0169194 A1* 9/2004 Noda .................... H01L 29/205
257/192
2007/0164326 A1* 7/2007 Okamoto .............. H01L 29/402
257/288

(Continued)

FOREIGN PATENT DOCUMENTS

JP         2007-266475 A    10/2007
JP         2011-035072 A     2/2011
JP         2011-135094 A     7/2011

OTHER PUBLICATIONS

International Search Report and Written Opinion issued in International Patent Application No. PCT/JP2016/000655, dated May 10, 2016; with partial English translation.

*Primary Examiner* — Sheikh Maruf
(74) *Attorney, Agent, or Firm* — McDermott Will & Emery LLP

(57) ABSTRACT

A nitride semiconductor device is provided that includes: a substrate; an n-type drift layer above the front surface of the substrate; a p-type base layer above the n-type drift layer; a gate opening in the base layer that reaches the drift layer; an n-type channel forming layer that covers the gate opening and has a channel region; a gate electrode above a section of the channel forming layer in the gate opening; an opening that is separated from the gate electrode and reaches the base layer; an opening formed in a bottom surface of said opening and reaching the drift layer; a source electrode covering the openings; and a drain electrode on the rear surface of the substrate.

9 Claims, 8 Drawing Sheets

(51) Int. Cl.

| | |
|---|---|
| *H01L 29/47* | (2006.01) |
| *H01L 21/822* | (2006.01) |
| *H01L 21/8234* | (2006.01) |
| *H01L 29/778* | (2006.01) |
| *H01L 27/04* | (2006.01) |
| *H01L 27/06* | (2006.01) |
| *H01L 27/088* | (2006.01) |
| *H01L 27/095* | (2006.01) |
| *H01L 27/098* | (2006.01) |
| *H01L 29/808* | (2006.01) |
| *H01L 29/812* | (2006.01) |
| *H01L 29/861* | (2006.01) |
| *H01L 29/868* | (2006.01) |
| *H01L 29/417* | (2006.01) |
| *H01L 29/06* | (2006.01) |
| *H01L 29/205* | (2006.01) |
| *H01L 29/20* | (2006.01) |
| *H01L 29/423* | (2006.01) |
| *H01L 29/10* | (2006.01) |

(52) U.S. Cl.
CPC .............. *H01L 27/04* (2013.01); *H01L 27/06* (2013.01); *H01L 27/088* (2013.01); *H01L 27/095* (2013.01); *H01L 27/098* (2013.01); *H01L 29/0619* (2013.01); *H01L 29/205* (2013.01); *H01L 29/41766* (2013.01); *H01L 29/47* (2013.01); *H01L 29/778* (2013.01); *H01L 29/7788* (2013.01); *H01L 29/7789* (2013.01); *H01L 29/808* (2013.01); *H01L 29/812* (2013.01); *H01L 29/861* (2013.01); *H01L 29/868* (2013.01); *H01L 29/0646* (2013.01); *H01L 29/1066* (2013.01); *H01L 29/2003* (2013.01); *H01L 29/42316* (2013.01)

(58) Field of Classification Search
USPC ......................................................... 257/471
See application file for complete search history.

(56) References Cited

U.S. PATENT DOCUMENTS

| | | | | |
|---|---|---|---|---|
| 2010/0032683 | A1* | 2/2010 | Ikeda | H01L 29/10 257/76 |
| 2010/0155720 | A1* | 6/2010 | Kaneko | H01L 29/2003 257/43 |
| 2011/0204381 | A1* | 8/2011 | Okada | H01L 21/8252 257/76 |
| 2011/0297961 | A1* | 12/2011 | Bunin | H01L 29/42316 257/76 |
| 2012/0223320 | A1* | 9/2012 | Dora | H01L 29/1608 257/76 |
| 2012/0273797 | A1* | 11/2012 | Okada | H01L 21/8252 257/76 |
| 2013/0126943 | A1* | 5/2013 | Tanaka | H01L 21/28575 257/194 |
| 2013/0313564 | A1* | 11/2013 | Okada | H01L 21/8252 257/76 |
| 2014/0097471 | A1* | 4/2014 | Briere | H01L 29/402 257/194 |
| 2016/0225889 | A1* | 8/2016 | Umeno | H01L 29/47 |
| 2018/0047840 | A1* | 2/2018 | Nakamura | H01L 29/7787 |

* cited by examiner

COMPARATIVE EXAMPLE: FORWARD BIAS

EMBODIMENT: FORWARD BIAS

COMPARATIVE EXAMPLE: REVERSE BIAS

EMBODIMENT: REVERSE BIAS

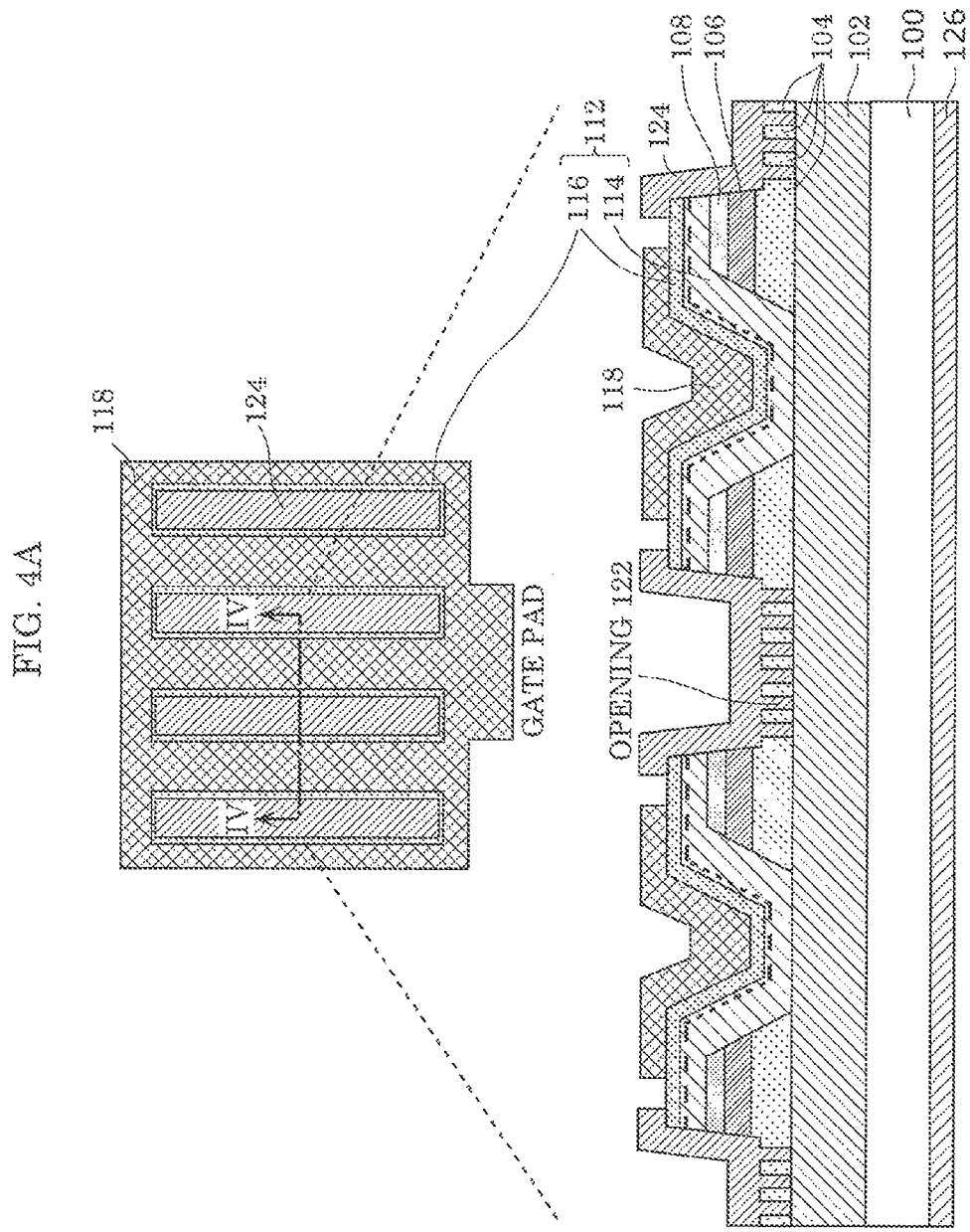

PLAN VIEW OF OPENINGS

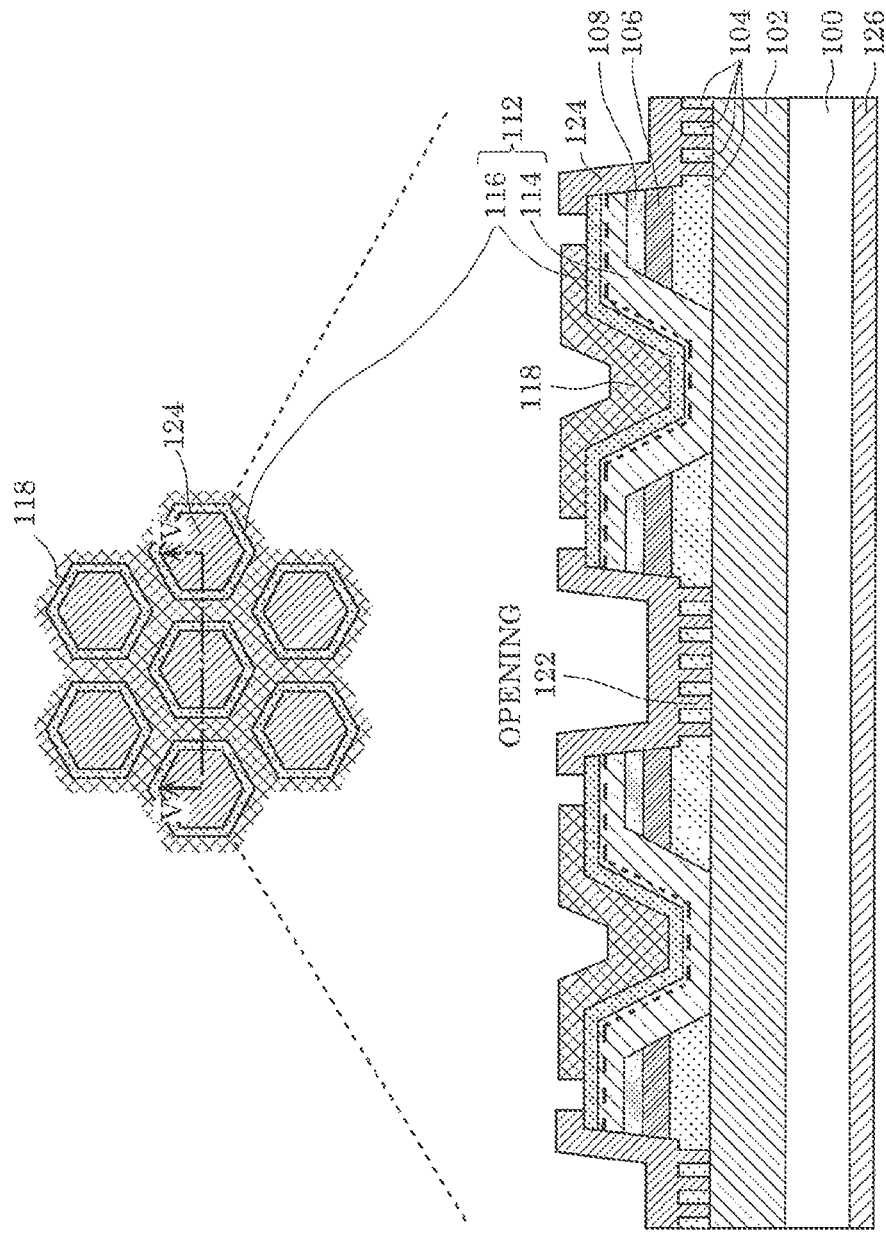

PLAN VIEW OF OPENINGS

NITRIDE SEMICONDUCTOR DEVICE

CROSS REFERENCE TO RELATED APPLICATIONS

This application is a U.S. continuation application of PCT International Patent Application Number PCT/JP2016/000655 filed on Feb. 9, 2016, claiming the benefit of priority of Japanese Patent Application Number 2015-054067 filed on Mar. 17, 2015, the entire contents of which are hereby incorporated by reference.

BACKGROUND

1. Technical Field

The present disclosure relates to a nitride semiconductor device.

2. Description of the Related Art

Japanese Unexamined Patent Application Publication No. 2011-135094 discloses a nitride semiconductor device including a bypass Schottky barrier diode (SBD) protector that protects against, for example, surge voltage. More specifically, the nitride semiconductor device disclosed in Japanese Unexamined Patent Application Publication No. 2011-135094 includes a vertical field effect transistor (FET) switch and a vertical SBD arranged in parallel on the same GaN substrate. This configuration achieves a high-current semiconductor device having a simple structure, favorable breakdown voltage characteristics, and low on-state resistance.

SUMMARY

However, with the semiconductor device according to Japanese Unexamined Patent Application Publication No. 2011-135094, there is a problem that the SBD protector prevents the nitride semiconductor vertical FET from fully making use of its inherent high breakdown voltage characteristics.

The present disclosure has been conceived in view of the above problem and has an object to provide a vertical nitride semiconductor device having high breakdown voltage characteristics and low loss characteristics.

In order to overcome the above-described problem, a nitride semiconductor device according to one aspect of the present disclosure includes: a substrate having a first major surface and a second major surface on opposite sides; a first nitride semiconductor layer of a first conductivity type above the first major surface; a second nitride semiconductor layer of a second conductivity type above the first nitride semiconductor layer; a first opening in the second nitride semiconductor layer, the first opening reaching the first nitride semiconductor layer; a third nitride semiconductor layer of the first conductivity type that covers the first opening and has a channel region; a gate electrode above a section of the third nitride semiconductor layer in the first opening; a second opening that is separated from the gate electrode and reaches the second nitride semiconductor layer; a third opening in a bottom surface of the second opening, the third opening reaching the first nitride semiconductor layer; a source electrode covering the second opening and the third opening; and a drain electrode on the second major surface.

With the nitride semiconductor device according to the present disclosure, it is possible to provide a nitride semiconductor device that has a high breakdown voltage and low loss.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 4A illustrates a plan view and cross sectional view of the nitride semiconductor device according to the embodiment;

FIG. 5A illustrates a plan view and cross sectional view of the nitride semiconductor device according to Variation 1 of the embodiment;

DETAILED DESCRIPTION OF THE EMBODIMENT (Underlying Knowledge Forming Basis of Present Disclosure)

The inventors discovered the following problems with the conventional semiconductor device recited in the BACKGROUND section.

Typically, compared to PN diodes, SBDs are advantageous due to their low initial voltage, but are disadvantageous due to their low breakdown voltage. In the semiconductor device disclosed in Japanese Unexamined Patent Application Publication No. 2011-135094, when the breakdown voltage of the SBD connected in parallel is lower than the breakdown voltage of the vertical FET, for example, even if the breakdown voltage of the vertical FET is sufficiently high, the breakdown voltage of the overall device is limited by the breakdown voltage of the SBD. In other words, with the semiconductor device disclosed in Japanese Unexamined Patent Application Publication No. 2011-135094, there is a problem that, by utilizing an SBD as a protector, breakdown voltage characteristics are insufficient.

In contrast, when the SBD is replaced with a PN diode, a sufficient breakdown voltage of the overall device can be achieved, but the initial voltage described above increases. When considering applications in inverters, since return current generates from the inductive load, the PN diodes will consume energy. In other words, when the initial voltage is high, conduction loss increases accordingly.

Figure 8:
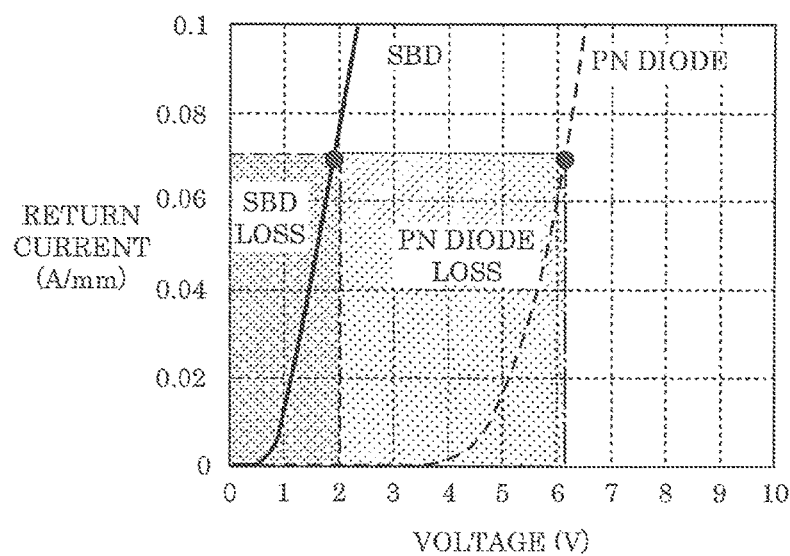
FIG. 8 is a graph illustrating the return current-voltage characteristics of an SBD and a PN diode.

FIG. 8 is a graph illustrating the return current-voltage characteristics of an SBD and a PN diode. More specifically, the graph compares loss exhibited in an SBD and a PN diode when return current is generated. As illustrated by the graph in FIG. 8, under the condition of the same return current being generated, the loss exhibited in the PN diode, whose operating voltage is high, is greater than the loss exhibited in the SBD. In other words, utilizing the PN diode as a protector is problematic because it results in an increase in conduction loss.

In order to overcome the above-described problem, a nitride semiconductor device according to one aspect of the present disclosure includes: a substrate having a first major surface and a second major surface on opposite sides; a first nitride semiconductor layer of a first conductivity type above the first major surface; a second nitride semiconductor layer of a second conductivity type above the first nitride semiconductor layer; a first opening in the second nitride semiconductor layer, the first opening reaching the first nitride semiconductor layer; a third nitride semiconductor layer of the first conductivity type that covers the first opening and has a channel region; a gate electrode above a section of the third nitride semiconductor layer in the first opening; a second opening that is separated from the gate electrode and reaches the second nitride semiconductor layer; a third opening in a bottom surface of the second opening, the third opening reaching the first nitride semiconductor layer; a source electrode covering the second opening and the third opening; and a drain electrode on the second major surface.

According to this aspect, it is possible to provide a nitride semiconductor device that has a high breakdown voltage and low loss.

The following describes a nitride semiconductor device according to an embodiment of the present disclosure with reference to the drawings. Note that each embodiment described below shows a specific example of the present disclosure. The numerical values, shapes, materials, elements, the arrangement and connection of the elements, etc., indicated in the following embodiment are mere examples, and therefore do not intend to limit the present disclosure. Those skilled in the art will readily appreciate that many modifications and combinations are possible in the exemplary embodiment and variations thereof without materially departing from the novel teachings and advantages of the present disclosure. Accordingly, all such modifications and combinations are intended to be included within the scope of the present disclosure.

Embodiment (1. Nitride Semiconductor Device Cross Sectional Structure)

Figure 1:
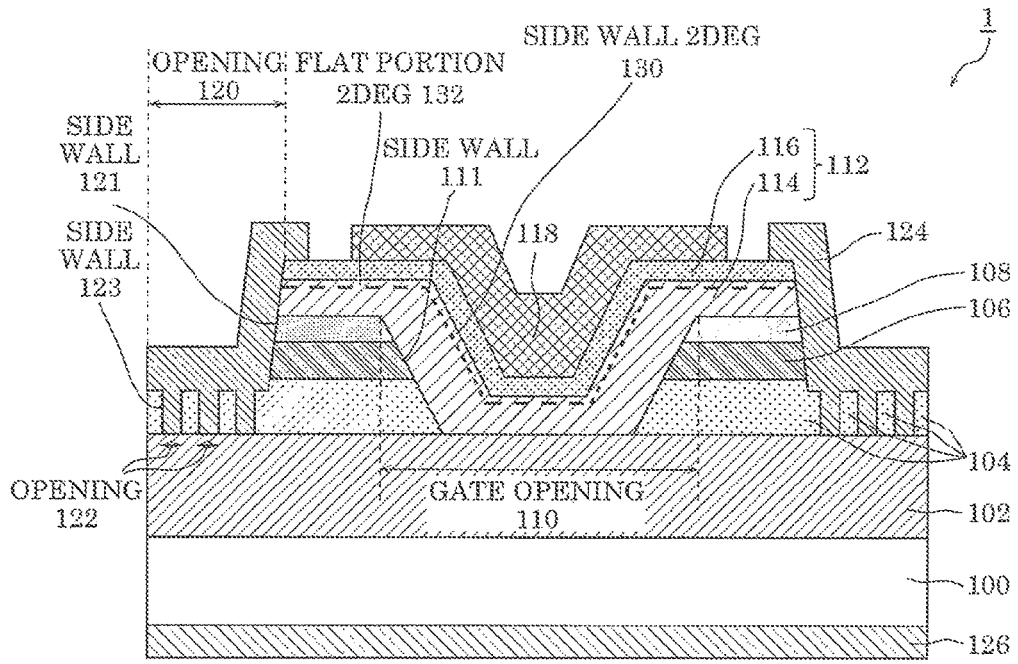
FIG. 1 is a cross sectional view of a nitride semiconductor device according to an embodiment.

FIG. 1 is a cross sectional view of the nitride semiconductor device according to the embodiment. As illustrated in FIG. 1, nitride semiconductor device 1 according to this embodiment includes substrate 100, drift layer 102, base layer 104, block layer 106, base layer 108, channel forming layer 112, gate electrode 118, source electrode 124, and drain electrode 126. Nitride semiconductor device 1 further includes gate opening 110 (first opening) that penetrates base layer 108, block layer 106, and base layer 104 to reach drift layer 102. Note that in this embodiment, an "opening" refers to a region that has been removed from a given layer stacked so as to extend parallel to the substrate surface, and refers to a region that is at least partially surrounded by the given layer in directions parallel to the substrate surface. Moreover, the opening defines a space when the nitride semiconductor device is still being manufactured, but after manufacturing of the nitride semiconductor device is complete, the space is filled with another layer. For example, gate opening 110 is formed in base layer 104, and after nitride semiconductor device 1 is manufactured, gate opening 110 is filled with channel forming layer 112 and gate electrode 118.

For example, substrate 100 is an n-type GaN substrate including n-type impurities and has a film thickness of approximately 300 μm. Note that Si or Ge can be used for the n-type impurities, and Mg can be used for the p-type impurities. Hereinafter, unless stated otherwise, "n-type" and "p-type" refer to the inclusion of any of the above respective impurities. Substrate 100 is not limited to a GaN substrate; substrate 100 may be any substrate that is conductive and lattice-matched to an extent permitted by the characteristics of the semiconductor layers and elements formed on substrate 100. For example, substrate 100 may be a $Ga_2O_3$ substrate or a SiC substrate. Substrate 100 may be a Si substrate, but in such cases, in order for the top surface to be lattice-matched, it is preferable that a buffer layer be formed.

Drift layer 102 is an n-type (first conductivity type) first nitride semiconductor layer formed above substrate 100. For example, drift layer 102 is an n-type GaN layer including n-type impurities and has a film thickness of approximately 8 μm. The concentration of the n-type impurities is, for example, in a range of from approximately $1 \times 10^{15}$ $cm^{-3}$ to $1 \times 10^{17}$ $cm^{-3}$.

Base layer 104 is a p-type (second conductivity type) second nitride semiconductor layer formed above drift layer 102, and has a film thickness of approximately 200 nm. Base layer 104 may be formed by crystal growth, and may be formed by injecting Mg into an undoped GaN layer.

Block layer 106 is formed above base layer 104, and may include any material so long as the layer functions as an insulating or semi-insulating layer. Block layer 106 has a film thickness of approximately 200 nm. Block layer 106 can inhibit the generation of parasitic npn structures and thus reduce the influence parasitic npn structures have on causing erroneous operation. Block layer 106 may be a GaN layer doped with at least $3 \times 10^{17}$ $cm^{-3}$ and more preferably at least $1 \times 10^{18}$ $cm^{-3}$ of C. Here, the concentration of Si or O n-type impurities is preferably lower than the concentration of C impurities. For example, the concentration of Si or O n-type impurities is preferably at most $5 \times 10^{16}$ $cm^{-3}$ and more preferably at most $2 \times 10^{16}$ $cm^{-3}$. Block layer 106 may be formed by ion injection of, for example, Mg, Fe, or B. So long as the ion is of a type that can produce a high-resistance state, the same advantageous effects as those achieved with Mg, Fe, and B can be achieved.

For example, base layer 108 is an n-type AlGaN layer that is undoped or includes n-type impurities, is formed above block layer 106, and has a film thickness of approximately 20 nm. Base layer 108 has a function of stopping diffusion of p-type impurities (for example, Mg) from base layer 104.

Channel forming layer 112 is an n-type (first conductivity type) third nitride semiconductor layer that covers gate opening 110, is disposed on the top surface of base layer 108, on the top surface of drift layer 102, and in gate opening 110, and includes electron transit layer 114 and electron supply layer 116 having a bigger band gap than electron transit layer 114. Note that electron transit layer 114 may be disposed above electron supply layer 116, but electron supply layer 116 is preferably disposed above electron transit layer 114. This disposes the two-dimensional electron gas (2DEG; to be described later) further from the p-type base layer 104, whereby the two-dimensional electron gas (2DEG) is less likely to be affected by the constricting effect produced by base layer 104, making it possible to reduce on-state resistance.

For example, electron transit layer 114 is a GaN layer that is undoped or includes n-type impurities such as Si, and is regrown to a film thickness of approximately 100 nm. For example, electron supply layer 116 is an AlGaN layer regrown to a film thickness of approximately 50 nm. The two-dimensional electron gas functioning as the channel region of electron transit layer 114 is formed in the vicinity of the interface between electron transit layer 114 and electron supply layer 116. Although not illustrated in the drawings, note that an AlN layer may be regrown between electron transit layer 114 and electron supply layer 116. The regrown AlN layer inhibits alloy scattering and increases channel mobility.

Gate electrode 118 is formed above channel forming layer 112 and includes, for example, Pd. Note that the gate electrode may include a material other than Pd, and may include any material that produces a Schottky contact with an n-type nitride semiconductor. For example, the gate electrode may include an Ni type material or Wsi. Furthermore, an insulating layer of SiN or $SiO_2$ may be formed between gate electrode 118 and channel forming layer 112. With this configuration, gate current can be inhibited and the threshold voltage can be shifted in the positive direction to realize a normally-off operation.

Moreover, nitride semiconductor device 1 includes, in a region separated from gate electrode 118, opening 120 (second opening) that reaches base layer 104. Opening 122 (third opening) is formed in the bottom surface of opening 120, and reaches drift layer 102. Opening 122 may comprise a single opening, but preferably comprises two or more openings. Note that upon completion of forming opening 120, source electrode 124 fills a portion of opening 120. Moreover, upon completion of forming opening 122, source electrode 124 fills opening 122.

Source electrode 124, which includes Ti/Al, is formed so as to cover side walls 121 of opening 120 and side walls 123 of opening 122. Source electrode 124 is in contact with two-dimensional electron gas (2DEG) formed in channel forming layer 112, and is in contact with base layer 104 and drift layer 102 via opening 122. Note that source electrode 124 need not include Ti/Al, and may include any material that produces an ohmic contact with n-type materials.

Drain electrode 126 is disposed on the rear surface of substrate 100. Drain electrode 126 may include any material that produces an ohmic contact with n-type materials.

One characteristic of nitride semiconductor device 1 according to this embodiment is the inclusion of a vertical GaN transistor and a merged PiN Schottky (MPS) diode connected in parallel. One merit of MPS diodes is that they have both the high breakdown voltage characteristics of PiN diodes (more specifically, in this embodiment, PN diodes) and low operating voltage characteristics of SBDs.

More specifically, the MPS diode included in nitride semiconductor device 1 is configured of a PN diode formed from base layer 104 and drift layer 102, and the SBD formed from source electrode 124 and drift layer 102 in the bottom of opening 122. Moreover, the PN diode and the SBD are alternately disposed due to openings 122. With this, compared to the conventional configuration, a higher breakdown voltage operation is possible, and energy such as surge voltage and return current can be consumed with little loss.

Hereinafter, the operating mechanism of a diode included in the nitride semiconductor device will be described with reference to FIG. 2A through FIG. 2D.

Figure 2A:
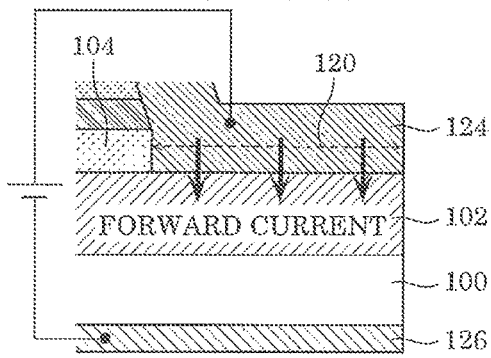
FIG. 2A is a schematic cross sectional view illustrating operations performed by a forward biased diode in a nitride semiconductor device according to a comparative example.
Figure 2B:
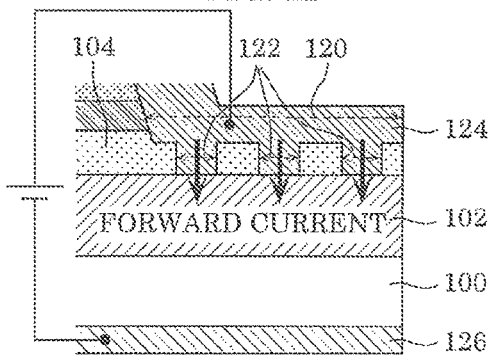
FIG. 2B is a schematic cross sectional view illustrating operations performed by a forward biased diode in the nitride semiconductor device according to the embodiment.

FIG. 2A is a schematic cross sectional view illustrating operations performed by a forward biased diode in a nitride semiconductor device according to a comparative example. FIG. 2B is a schematic cross sectional view illustrating operations performed by a forward biased diode in the nitride semiconductor device according to the embodiment. As illustrated in FIG. 2A, the nitride semiconductor device according to the comparative example does not include opening 122, and opening 120 directly reaches drift layer 102. In contrast, as illustrated in FIG. 2B, in nitride semiconductor device 1 according to this embodiment, discrete openings 122 are formed between opening 120 and drift layer 102, and sections of base layer 104 are formed between openings 122.

As illustrated in FIG. 2A and FIG. 2B, when the diode is forward biased, in both the comparative example and the embodiment, since forward current flows through the Schottky connection region between source electrode 124 and drift layer 102, a low operating voltage can be achieved. In other words, since nitride semiconductor device 1 according to the embodiment includes an SBD between source electrode 124 and drift layer 102, a low operating voltage can be achieved when the diode is forward biased, whereby low-loss can be achieved when return current flows through the SBD.

Figure 2C:
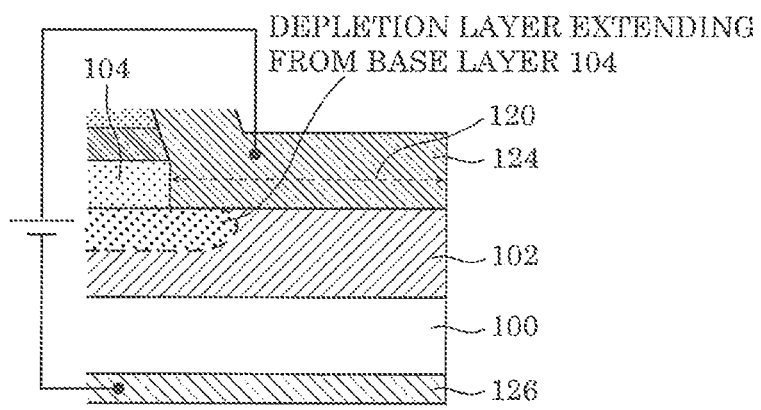
FIG. 2C is a schematic cross sectional view illustrating operations performed by a reverse biased diode in the nitride semiconductor device according to the comparative example.
Figure 2D:
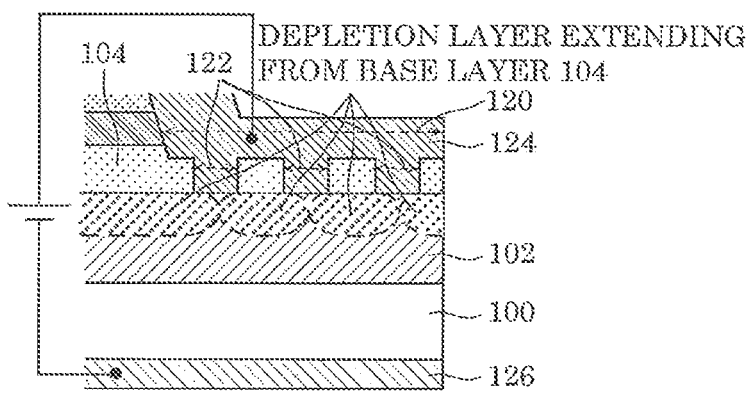
FIG. 2D is a schematic cross sectional view illustrating operations performed by a reverse biased diode in the nitride semiconductor device according to the embodiment.

FIG. 2C is a schematic cross sectional view illustrating operations performed by a reverse biased diode in the nitride semiconductor device according to the comparative example. FIG. 2D is a schematic cross sectional view illustrating operations performed by a reverse biased diode in the nitride semiconductor device according to the embodiment.

As illustrated in FIG. 2C, when the diode is reverse biased, in the comparative example, since no opening 122 is formed, a depletion layer extending from base layer 104 cannot reach the Schottky connection region in the central region of opening 120. As a result, even when the diode is reverse biased, a large leak current flows through the Schottky connection region, decreasing the breakdown voltage.

In contrast, as illustrated in FIG. 2D, in the embodiment in which openings 122 are formed, since base layer 104 is formed below the central region of opening 120 and the depletion layer formed by base layer 104 and drift layer 102 widens, the depletion layer can be elongated across the entire bottom surfaces of openings 122, that is to say, across the entire Schottky connection region. As a result, leak voltage can be reduced and a high breakdown voltage can be secured.

Note that from the above point of view, opening 122 preferably comprises a plurality of openings. With this, when the diode is reverse biased, the depletion layer can be more efficiently widened across the bottom surfaces of openings 122 from base layer 104, which further increases the breakdown voltage.

Moreover, the width of each opening 122 is preferably in a range of from approximately 0.5 µm to 10 µm, and more preferably in a range of from approximately 1 µm to 5 µm. Moreover, the width of each discrete section of base layer 104 between openings 122 is preferably in a range of from approximately 0.5 µm to 10 µm, and more preferably in a range of from approximately 1 µm to 5 µm. However, the structure is not limited to this example, so long as high breakdown voltage and low loss are achieved by the parallel connection between the PN diode and the SBD.

Figure 3:
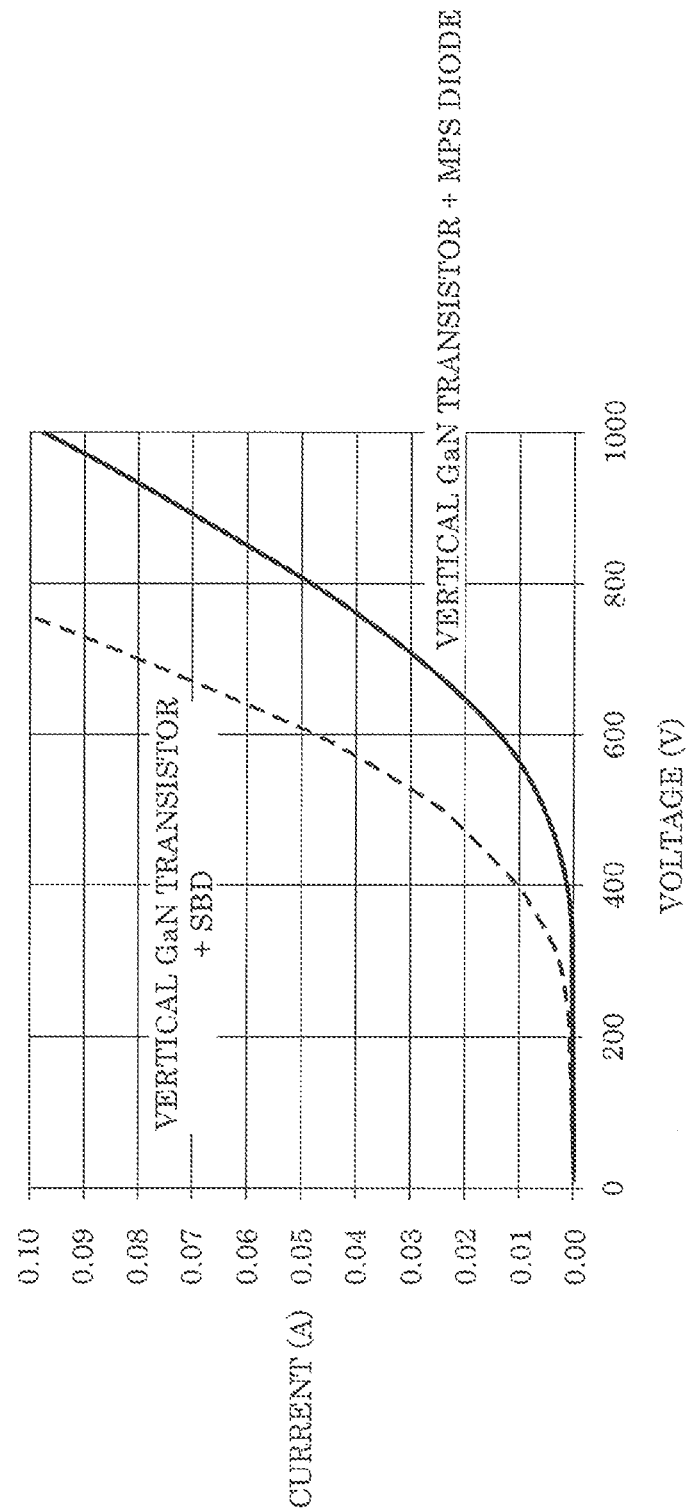
FIG. 3 is a graph illustrating the current-voltage characteristics of a device including an SBD connected in parallel to a vertical nitride semiconductor transistor, and the current-voltage characteristics of a device including an MPS diode connected in parallel to a vertical nitride semiconductor transistor.

FIG. 3 is a graph illustrating the current-voltage characteristics of a device in which an SBD is connected in parallel to a vertical nitride semiconductor transistor, and the current-voltage characteristics of a device in which an MPS diode is connected in parallel to a vertical nitride semiconductor transistor. More specifically, the graph in FIG. 3 illustrates a comparison of the breakdown voltage characteristics of the two devices described above. As can be seen from the graph, the device in which an MPS diode is connected in parallel has a higher breakdown voltage than the device in which an SBD is connected in parallel.

In other words, since nitride semiconductor device 1 according to this embodiment includes an MPS diode connected in parallel to a vertical GaN transistor, under reverse bias, the function of the PN diode maintains a high breakdown voltage and under forward bias, the function of the SBD keeps the initial voltage low, whereby loss can be decreased upon the return current flowing through the MPS diode.

(2. Nitride Semiconductor Device Planar Structure)

Figure 4B:
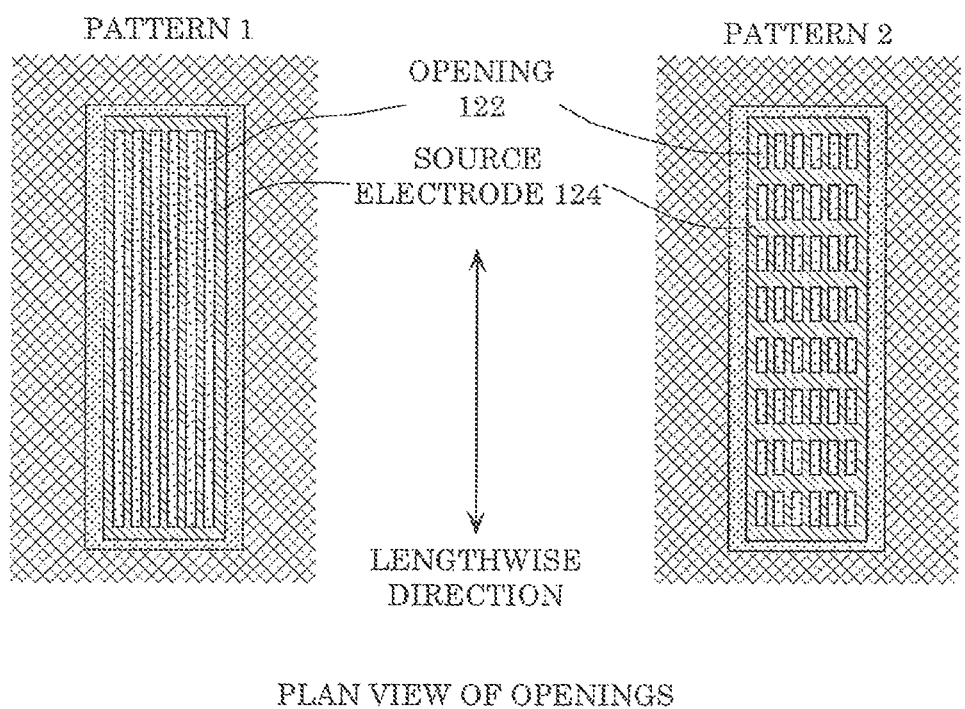
FIG. 4B illustrates a plan view layout of second and third openings in the nitride semiconductor device according to the embodiment.

FIG. 4A illustrates a plan view and cross sectional view of the nitride semiconductor device according to the embodiment. FIG. 4B illustrates a plan view layout of the second and third openings in the nitride semiconductor device according to the embodiment.

As illustrated in FIG. 4A, in a plan view, the rectangular source electrodes 124 are regularly arranged so as to integrate the device in a finger layout. In a plan view, gate electrode 118 surrounds source electrodes 124.

As illustrated in FIG. 4B, in a plan view, opening 122 may comprise one continuous opening in the lengthwise direction of source electrode 124 (pattern 1), and may comprise a plurality of openings discontinuous in the lengthwise direction (for example, eight in FIG. 4B) (pattern 2).

Figure 5B:
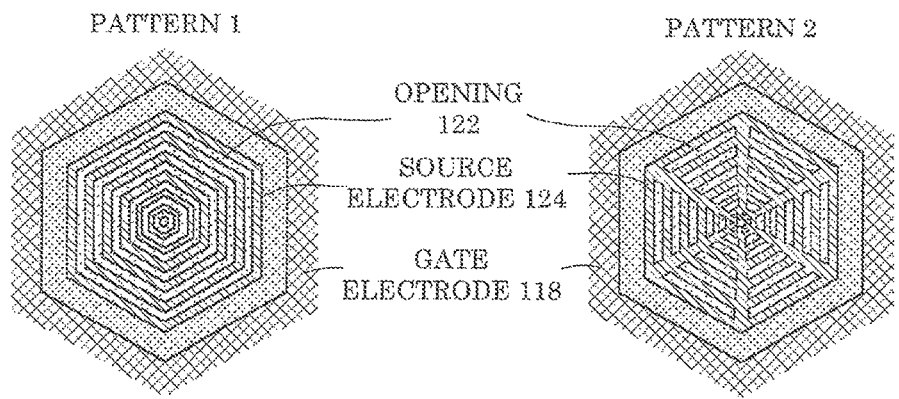
FIG. 5B illustrates an example of a plan view layout of second and third openings in the nitride semiconductor device according to Variation 1 of the embodiment.

FIG. 5A illustrates a plan view and cross sectional view of the nitride semiconductor device according to Variation 1 of the embodiment. FIG. 5B illustrates an example of a plan view layout of the second and third openings in the nitride semiconductor device according to Variation 1 of the embodiment.

As illustrated in FIG. 5A, in a plan view, the hexagonal source electrodes 124 are regularly arranged so as to integrate the device in a hexagonal configuration. In a plan view, gate electrode 118 surrounds source electrodes 124.

As illustrated in FIG. 5B, in a plan view, opening 122 may have a continuous hexagonal loop shape that follows the outline of source electrode 124 (pattern 1), and may be broken up into a plurality of discontinuous openings (for example, six in FIG. 5B) that follow the outline of source electrode 124 (pattern 2).

Applying the device layouts illustrated in FIG. 4A, FIG. 4B, FIG. 5A, and FIG. 5B makes it possible to improve surface area efficiency.

(3. Gate Structure Variation)

Figure 6:
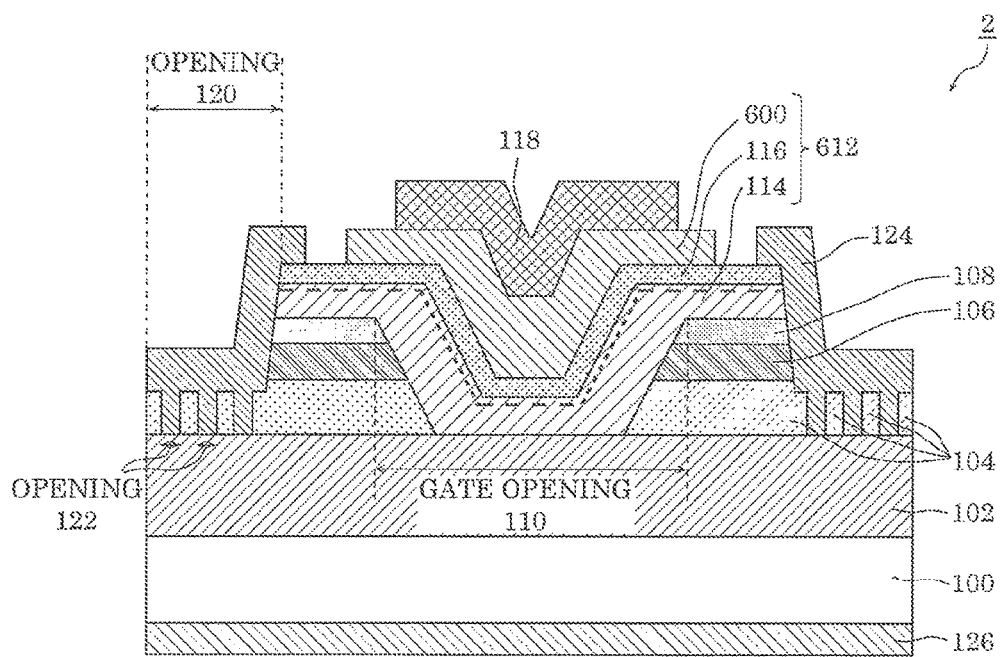
FIG. 6 is a cross sectional view of the nitride semiconductor device according to Variation 2 of the embodiment.

FIG. 6 is a cross sectional view of the nitride semiconductor device according to Variation 2 of the embodiment. Nitride semiconductor device 2 according to this variation differs from nitride semiconductor device 1 in that it further includes nitride semiconductor layer 600. Hereinafter, description of configurations that are the same as in nitride semiconductor device 1 will be omitted, and the description will focus on the points of difference from nitride semiconductor device 1.

As illustrated in FIG. 6, nitride semiconductor device 2 according to this embodiment includes substrate 100, drift layer 102, base layer 104, block layer 106, base layer 108, channel forming layer 612, gate electrode 118, source electrode 124, and drain electrode 126. Nitride semiconductor device 2 further includes gate opening 110 (first opening) that penetrates base layer 108, block layer 106, and base layer 104 to reach drift layer 102. Moreover, nitride semiconductor device 2 includes, in a region separated from gate electrode 118, opening 120 (second opening) that reaches base layer 104. Opening 122 (third opening) is formed in the bottom surface of opening 120, and reaches drift layer 102.

Channel forming layer 612 includes nitride semiconductor layer 600, electron transit layer 114, and electron supply layer 116.

Nitride semiconductor layer 600 is a p-type nitride semiconductor layer (fourth nitride semiconductor layer) disposed between electron supply layer 116 and gate electrode 118. P-type nitride semiconductor layer 600 is, for example, a p-type GaN or AlGaN layer including p-type impurities. With nitride semiconductor layer 600 having the above configuration, the potential of the channel region increases, which makes it possible to increase the threshold voltage, further making it possible to realize a normally-off configuration.

Note that an insulating film of, for example, SiN or $SiO_2$ may be inserted in place of the p-type nitride semiconductor layer 600. In other words, any material may be used so long as it increases the channel potential.

(4. Source Structure Variation)

Figure 7:
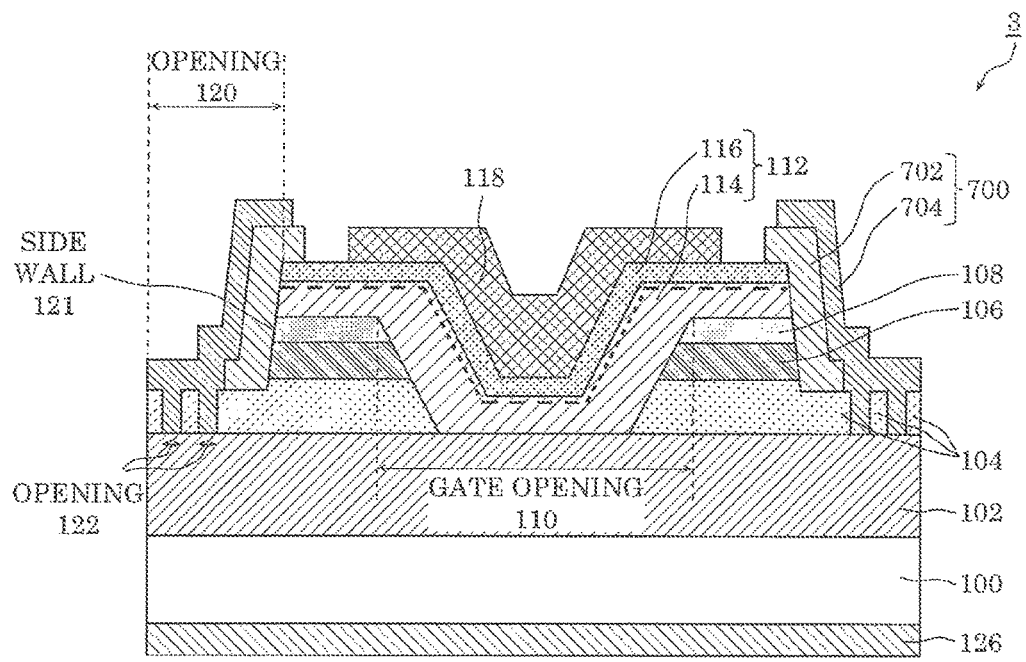
FIG. 7 is a cross sectional view of the nitride semiconductor device according to Variation 3 of the embodiment.

FIG. 7 is a cross sectional view of the nitride semiconductor device according to Variation 3 of the embodiment. Nitride semiconductor device 3 according to this variation differs from nitride semiconductor device 1 in regard to the configuration of the source electrode. Hereinafter, description of configurations that are the same as in nitride semiconductor device 1 will be omitted, and the description will focus on the points of difference from nitride semiconductor device 1.

As illustrated in FIG. 7, nitride semiconductor device 3 according to this embodiment includes substrate 100, drift layer 102, base layer 104, block layer 106, base layer 108, channel forming layer 112, gate electrode 118, source electrode 700, and drain electrode 126. Nitride semiconductor device 3 further includes gate opening 110 (first opening) that penetrates base layer 108, block layer 106, and base layer 104 to reach drift layer 102. Moreover, nitride semiconductor device 3 includes, in a region separated from gate electrode 118, opening 120 (second opening) that reaches base layer 104. Opening 122 (third opening) is formed in the bottom surface of opening 120, and reaches drift layer 102.

In this variation, source electrode 700 includes metal layer 702 and metal layer 704 including a different metal from metal layer 702. Metal layer 704 corresponds to the second metal layer that is in contact with base layer 104 and drift layer 102 in opening 122. Metal layer 702 corresponds to the first metal layer that is in contact with the two-dimensional electron gas (2DEG) on side walls 121 of opening 120, and is electrically connected to metal layer 704. Metal layer 704 functions as an anode.

Metal layer 704 includes at least one of Pd, Ni, Au, and Pt; a material that produces ohmic contact with base layer 104, which is a p-type nitride semiconductor layer, is used. This makes it possible to achieve a more stable electrical connection with base layer 104. Accordingly, under reverse bias (when a positive bias is applied to drain electrode 126), the depletion layer can widen more stably from base layer 104, thereby making it possible to further reduce reverse leak and further increase the breakdown voltage.

Note that Variation 3 illustrated in FIG. 7 and Variation 2 illustrated in FIG. 6 may be combined.

(5. Relation Between Gate Terminal Position and Threshold Voltage)

Next, the relation between the gate terminal position and threshold voltage will be described. Note that the gate terminal is, in nitride semiconductor device 1 and nitride semiconductor device 3, the end of gate electrode 118 in the alignment direction of gate electrode 118 and source electrode 124. Moreover, in nitride semiconductor device 2, the gate terminal is the end of nitride semiconductor layer 600 in the alignment direction of gate electrode 118 and source electrode 124.

When the gate terminal is positioned inside gate opening 110, the transistor threshold voltage is determined only by side wall 111 (side wall 2DEG 130) of gate opening 110. With this arrangement, the carrier concentration of the flat portion (flat portion 2DEG 132) of channel forming layer 112 parallel to the major surface of substrate 100 can be increased, making it possible to reduce on-state resistance.

However, when the gate terminal is positioned outside gate opening 110, the transistor threshold voltage is the larger threshold among the threshold voltage of side wall 111 (side wall 2DEG 130) of gate opening 110 and the threshold voltage of the flat portion (flat portion 2DEG 132) outside gate opening 110. For example, when the transistor threshold voltage is to be determined according to the flat portion, there is only a need to reduce the threshold voltage of side wall 111 of gate opening 110. In this case, the film thickness of electron transit layer 114 in a direction parallel to the major surface of substrate 100 may be reduced to a thickness smaller than the film thickness of electron transit layer 114 in a direction parallel to side wall 111 of gate opening 110. With this, the distance between the two-dimensional electron gas (2DEG) on side wall 111 of gate opening 110 and base layer 104 is longer than the distance between the two-dimensional electron gas (2DEG) in the flat portion of channel forming layer 112 and base layer 104.

With this configuration, the two-dimensional electron gas on side wall 111 of gate opening 110 can reduce the effects of the depletion layer extending from base layer 104 compared to the flat portion, and can thus selectively lower the threshold voltage of the channel region on side wall 111. Accordingly, the transistor threshold voltage can be determined by the flat portion of channel forming layer 112.

(6. Electron Transit Layer Film Thickness)

Typically, the GaN crystal growth in vertical devices is performed such that the C-plane of the GaN crystals is parallel with a major surface (top surface) of the substrate. In these cases, since the polarization of two-dimensional electron gas that is oblique relative to the substrate major surface is smaller than two-dimensional electron gas that is parallel to the substrate major surface, carrier concentration decreases accordingly.

From this viewpoint, the carrier concentration of side wall 2DEG 130, which is the two-dimensional electron gas formed on side wall 111 of gate opening 110, is less than the carrier concentration of flat portion 2DEG 132, which is the two-dimensional electron gas in the flat portion. In other words, since side wall 2DEG 130 is more likely to be affected by the constricting effect produced by the depletion layer extending from base layer 104 than flat portion 2DEG 132, a position further from base layer 104 makes it possible to further reduce on-state resistance.

Moreover, the thinner the portion of electron transit layer 114 outside gate opening 110 is, the shallower opening 120 can be formed. The shallower opening 120 is, the shorter the processing time is, and when source electrode 124 is formed by vapor deposition, breaks in vapor deposition film, that is to say, the phenomenon whereby the deposition film becomes discontinuous, are easier to prevent.

Accordingly, the film thickness of the portion of electron transit layer 114 disposed outside gate opening 110 is preferably smaller than the film thickness of the portion of electron transit layer 114 that is disposed on side wall 111 of gate opening 110. This configuration makes processing easier and reduces on-state resistance.

Other Embodiments

The nitride semiconductor device according to the present disclosure has been described according to an exemplary embodiment and Variations 1 through 3 thereof, but is not limited thereto. Those skilled in the art will readily appreciate that variations resulting from arbitrarily combining elements from the above embodiment and any of the variations thereof, variations resulting from modifying the above embodiment and any of the variations thereof, and various devices including the nitride semiconductor device according to the above embodiment and variations thereof, are included in the present disclosure so long as they do not materially depart from the novel teachings and advantages of the present disclosure.

INDUSTRIAL APPLICABILITY

The nitride semiconductor device according to the present disclosure is applicable to, for example, power devices used in, for example, electronic circuits in consumer equipment.

What is claimed is:
1. A nitride semiconductor device, comprising:
a substrate having a first major surface and a second major surface on opposite sides;
a first nitride semiconductor layer of a first conductivity type above the first major surface;
a second nitride semiconductor layer of a second conductivity type above the first nitride semiconductor layer;
a first opening in the second nitride semiconductor layer, the first opening reaching the first nitride semiconductor layer;
a third nitride semiconductor layer of the first conductivity type that covers the first opening and has a channel region;
a gate electrode above a section of the third nitride semiconductor layer in the first opening;
a second opening that is separated from the gate electrode and reaches the second nitride semiconductor layer;

a third opening in a bottom surface of the second opening, the third opening reaching the first nitride semiconductor layer;

a source electrode covering the second opening and the third opening; and a drain electrode on the second major surface.

2. The nitride semiconductor device according to claim 1, wherein the third opening comprises a plurality of discrete openings.

3. The nitride semiconductor device according to claim 1, wherein when a reverse bias is applied between the drain electrode and the source electrode, a depletion layer formed by the first nitride semiconductor layer and the second nitride semiconductor layer widens across an entire bottom surface of the third opening, below the second opening.

4. The nitride semiconductor device according to claim 1, wherein the third nitride semiconductor layer includes:

an electron transit layer including a nitride semiconductor; and an electron supply layer including a nitride semiconductor and having a band gap greater than a band gap of the electron transit layer.

5. The nitride semiconductor device according to claim 4, wherein the electron supply layer is above the electron transit layer.

6. The nitride semiconductor device according to claim 5, wherein the substrate includes a nitride semiconductor, the first major surface is a C-plane, and a film thickness of the electron transit layer is greater in a region on a side wall of the first opening than in a region outside the first opening.

7. The nitride semiconductor device according to claim 4, wherein the source electrode includes:

a first metal layer in contact with a two-dimensional electron gas at an interface between the electron transit layer and the electron supply layer; and a second metal layer in contact with the first nitride semiconductor layer and the second nitride semiconductor layer, in the third opening.

8. The nitride semiconductor device according to claim 7, wherein the second metal layer is in ohmic contact with the second nitride semiconductor layer.

9. The nitride semiconductor device according to claim 1, further comprising a fourth nitride semiconductor layer of the second conductivity type between the gate electrode and the third nitride semiconductor layer.

* * * * *